(12) United States Patent
Sasaki

(10) Patent No.: US 7,540,190 B2
(45) Date of Patent: Jun. 2, 2009

(54) SEMICONDUCTOR DEVICE WITH ACCELERATION SENSOR

(75) Inventor: Makoto Sasaki, Miyazaki (JP)

(73) Assignee: Oki Semiconductor Co., Ltd., Tokyo (JP)

(*) Notice: Subject to any disclaimer, the term of this patent is extended or adjusted under 35 U.S.C. 154(b) by 168 days.

(21) Appl. No.: 11/531,700

(22) Filed: Sep. 14, 2006

(65) Prior Publication Data

US 2007/0089511 A1 Apr. 26, 2007

(30) Foreign Application Priority Data

Sep. 29, 2005 (JP) .............................. 2005-283530

(51) Int. Cl.
*G01P 1/02* (2006.01)
*G01P 15/00* (2006.01)

(52) U.S. Cl. ...................... 73/493; 73/514.16

(58) Field of Classification Search .................. 73/493, 73/431, 514.33, 514.34, 514.29, 514.16
See application file for complete search history.

(56) References Cited

U.S. PATENT DOCUMENTS

| | | | | | |
|---|---|---|---|---|---|
| 5,233,871 | A | * | 8/1993 | Schwarz et al. | 73/493 |
| 5,379,640 | A | * | 1/1995 | Yamamoto | 73/514.14 |
| 5,507,182 | A | * | 4/1996 | Yamada et al. | 73/514.33 |
| 6,769,319 | B2 | * | 8/2004 | McDonald et al. | 73/866.1 |
| 6,892,578 | B2 | * | 5/2005 | Saitoh et al. | 73/514.33 |
| 7,019,231 | B2 | * | 3/2006 | Ishikawa et al. | 200/61.45 R |
| 7,322,239 | B2 | * | 1/2008 | Kurogi | 73/514.01 |
| 7,331,230 | B2 | * | 2/2008 | Takeyari et al. | 73/514.33 |

FOREIGN PATENT DOCUMENTS

JP 2004-309188 A 11/2004
JP 2005-127750 A 5/2005

* cited by examiner

*Primary Examiner*—Helen C. Kwok
(74) *Attorney, Agent, or Firm*—Rabin & Berdo, P.C.

(57) ABSTRACT

A semiconductor device includes a package having a cavity in the interior thereof, a support member that extends out from a face of the cavity, and a semiconductor element fixed to the support member without contacting the faces that form the cavity.

18 Claims, 11 Drawing Sheets

SEMICONDUCTOR DEVICE WITH ACCELERATION SENSOR

BACKGROUND OF THE INVENTION

1. Field of the Invention

The present invention relates to a semiconductor device which in particular contains a semiconductor element having a hollow construction.

2. Background Information

In recent years, a type of semiconductor element having a hollow region inside for enabling a portion of the element to be displaced, such as a semiconductor acceleration sensor chip using an MEMS (micro electro mechanical system), has come to be widely used. In the following, this type of semiconductor element will be referred to as a hollow construction semiconductor element.

One typical kind of hollow construction semiconductor element would be a semiconductor acceleration sensor chip, as mentioned above. Normally, a semiconductor acceleration sensor chip is housed in the interior of a package made of ceramic, and is structured in a way such that acceleration can be detected using a piezoresistive effect, i.e., a phenomenon in which a resistance value changes in proportion to a generated stress.

To be more precise, a typical semiconductor acceleration sensor chip comprises a fixing portion, a spindle body and multiple beams, for instance. Each beam has flexibility, and has one end thereof fixed to the fixing portion and the other end thereof fixed to the spindle body, while keeping the spindle body in a movable state with respect to the fixing portion. These beams have piezoresistive elements attached thereto, respectively, and by having these piezoresistive elements connected among one another through wiring patterns, a Wheatsone bridge circuit can be established.

In a semiconductor acceleration sensor chip having such hollow construction, when there is a change in speed, the beams will bend due to the stress generated by the inertial movement of the spindle body. At the same time, the piezoresistive elements attached to the beams will also bend. Due to such bending, the resistance value of each piezoresistive element will change, resulting in a change in the resistance balance in the Wheatsone bridge. Acceleration can be detected by measuring such change in the resistance balance as a current change or a voltage change.

Such semiconductor acceleration sensor chip as described above is usually fixed to the bottom of the cavity inside the package using an adhesive material or the like. However, when the semiconductor acceleration sensor chip is fixed directly to the package, there is a possibility that residual stress will be generated due to the heat produced when a wire bonding process is performed for connecting the electrode pads of the semiconductor acceleration chip and electrode pads of the package, and when a die-bonding process is performed for fixing the package for housing the semiconductor acceleration sensor chip to a circuit substrate, etc., for instance.

For example, Japanese Laid-Open Patent Application No. 2004-309188 (hereinafter to be referred to as patent reference 1) discloses a certain structure which copes with such problem.

Patent reference 1 introduces a structure in which steps having top faces that are higher than the bottom face of the cavity inside the package are formed on the sides of the cavity, the sides of the semiconductor acceleration sensor chip are flanged, and the flanged parts are fixed to the steps, and thus, the semiconductor acceleration sensor chip is fixed inside the package.

On the other hand, Japanese Laid-Open Patent Application No. 2005-127750 (hereinafter to be referred to as patent reference 2) introduces a structure in which the semiconductor acceleration sensor chip is bonded to the package using flip-chip technology. According to patent reference 2, it is possible to miniaturize the apparatus including the package as a whole.

In the case of fixing a semiconductor element with a hollow construction such as a semiconductor acceleration sensor chip directly to the package, there is a possibility that the characteristics of the semiconductor element will be changed because deformation of the package due to external stress, heat expansion, etc. can be easily transmitted to the semiconductor element, and this may result in inducing malfunction. Moreover, since the heat expansion coefficient is different between the package and the semiconductor element, stress is generated between the package and the semiconductor element after heating, and this may change the characteristics of the semiconductor element, resulting in inducing malfunction.

The structure as disclosed in patent reference 1 includes some parts where the package and the semiconductor element (i.e., the semiconductor acceleration sensor chip) are directly attached to each other. Therefore, deformation of the package will be transmitted to the semiconductor element through the attaching parts, which may result in changing the characteristics of the semiconductor element.

The structure as disclosed in patent reference 2, the semiconductor element (i.e., the semiconductor acceleration sensor chip) is directly bonded to a portion of the package using flip-chip technology. Therefore, deformation of the package is transmitted to the semiconductor element through the boding parts, which may result in changing the characteristics of the semiconductor element. Moreover, due to the heat expansion coefficient being different between the package and the semiconductor element, stress may be generated between the package and the semiconductor element after heating, which may result in changing the characteristics of the semiconductor element and inducing malfunction.

In view of the above, it will be apparent to those skilled in the art from this disclosure that there exists a need for an improved semiconductor device. This invention addresses this need in the art as well as other needs, which will become apparent to those skilled in the art from this disclosure.

SUMMARY OF THE INVENTION

It is therefore an object of the present invention to resolve the above-described problems and to provide a semiconductor device which is capable of reducing stress caused due to the difference in the heat expansion coefficient between a package and a semiconductor element, and capable of operating stably against deformation of the package housing the semiconductor element, which may be caused by external stress and heat expansion.

In accordance with one aspect of the present invention, a semiconductor device comprises a package having a cavity in the interior thereof, a support member projecting out from a face of the cavity, and a semiconductor element fixed to the support member without contacting the faces of the cavity.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
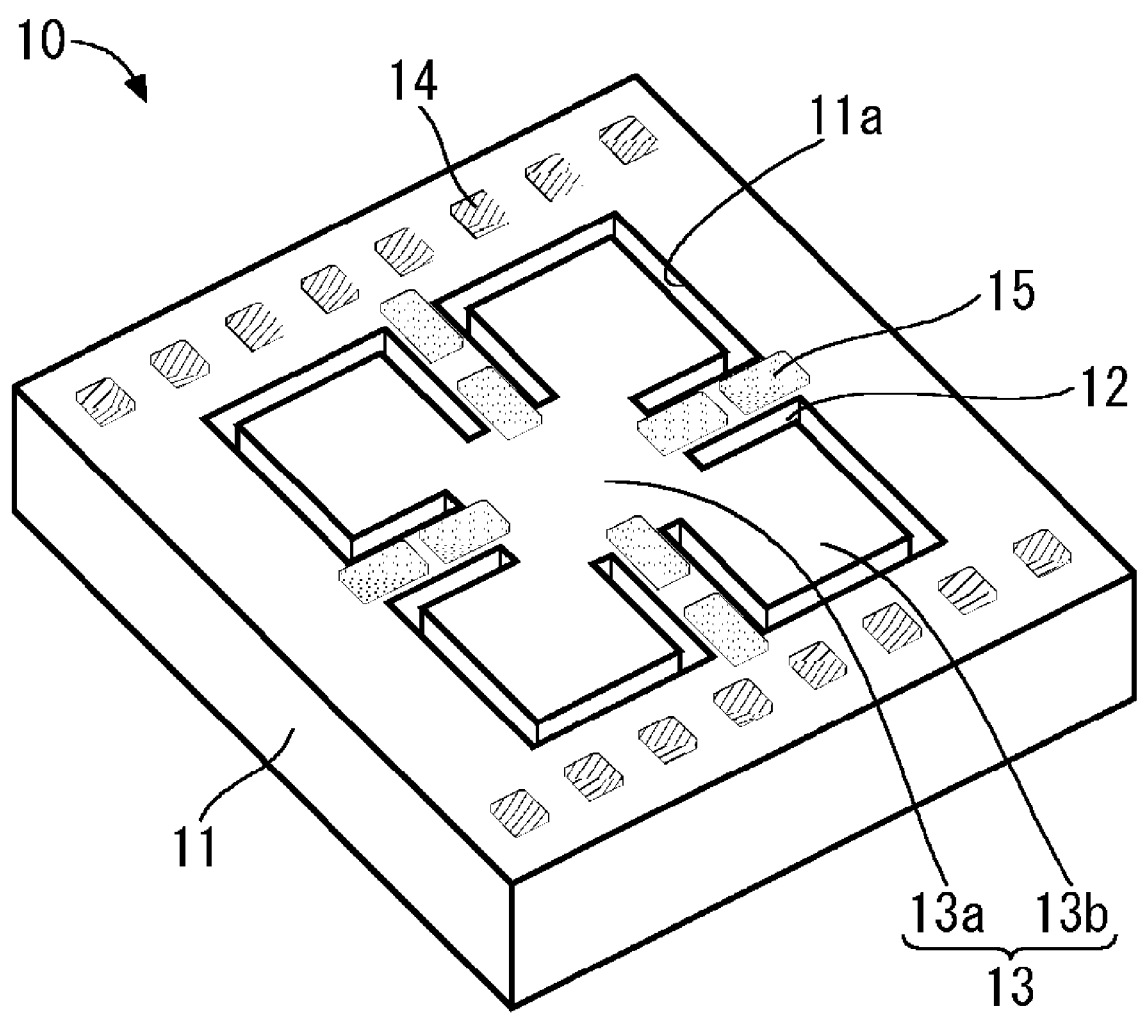
FIG. 1 is a perspective view showing the overall structure of a semiconductor acceleration sensor chip, which is a three-dimensional acceleration sensor applied in the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

First, a first embodiment of the present invention will be described in detail with reference to the drawings. The structure shown in each drawing is shown in certain shape, size and position in a way simple enough to show the outline of the present invention. Therefore, the shape, size and position of the present invention are not limited to the ones shown in the drawings. In addition, in each drawing, in order to clearly show the structure, a portion of the hatching in the cross-sectional surface thereof is omitted. Moreover, numerical values indicated in the following description are only given as examples, and therefore, they are not in the nature of limiting the present invention. These conditions apply to all the embodiments in the same way.

In the following, a semiconductor acceleration sensor chip is applied as a semiconductor element having a hollow construction, and a description will be given of a semiconductor device including the semiconductor acceleration sensor chip and of a method of manufacturing such semiconductor device, as an example of the present invention.

Structure of the Semiconductor Acceleration Sensor Chip 10

Now, the structure of a semiconductor acceleration sensor chip 10 according to the first embodiment of the present invention will be described in detail with reference to the drawings. This embodiment will show a case of applying a three-dimensional acceleration sensor using the piezoresistive effect, i.e., a phenomenon in which the resistance value changes in proportion to stress generated.

Figure 2:
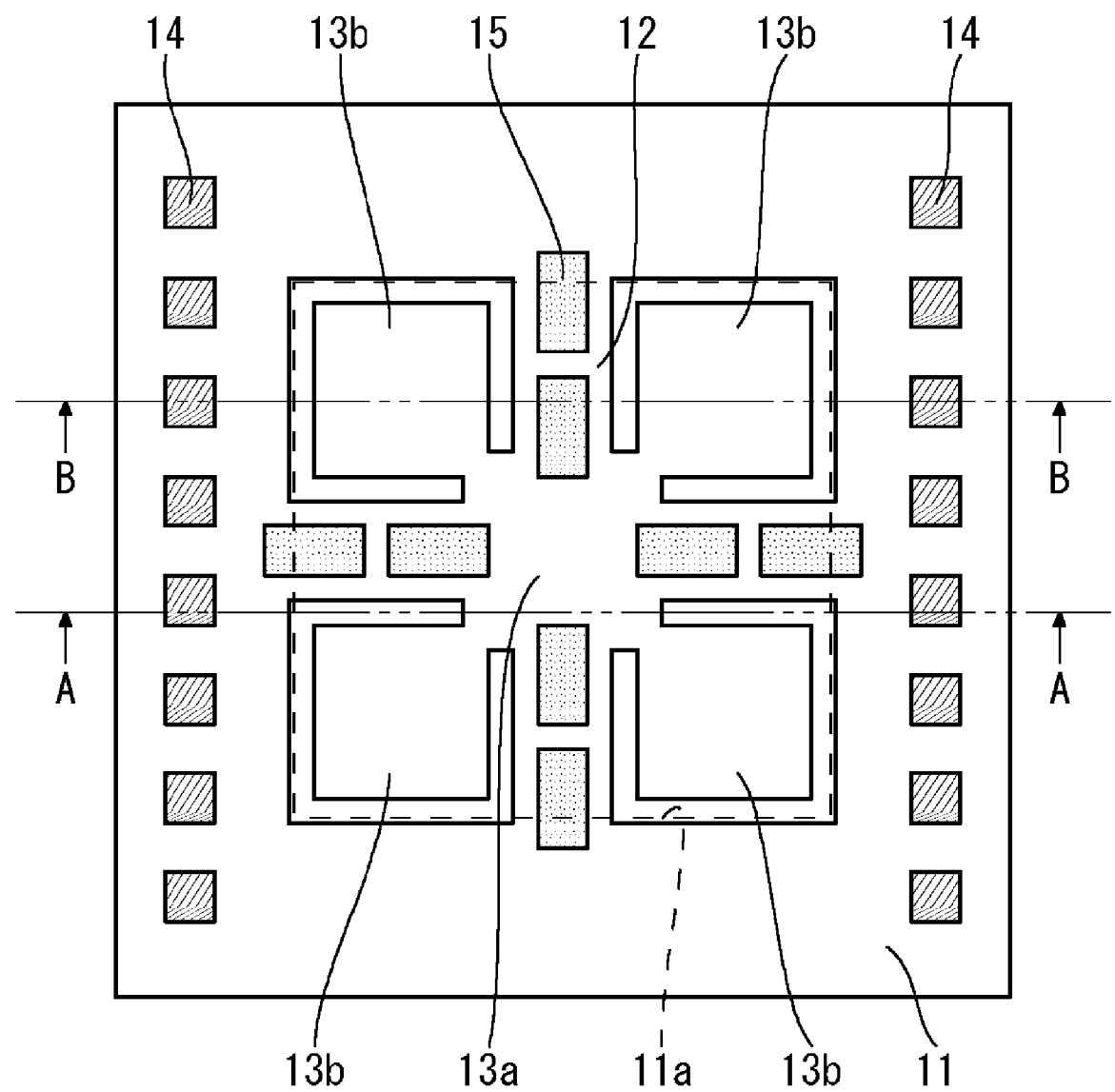
FIG. 2 is an overhead view of the semiconductor acceleration sensor chip applied in the present invention.
Figure 3A:
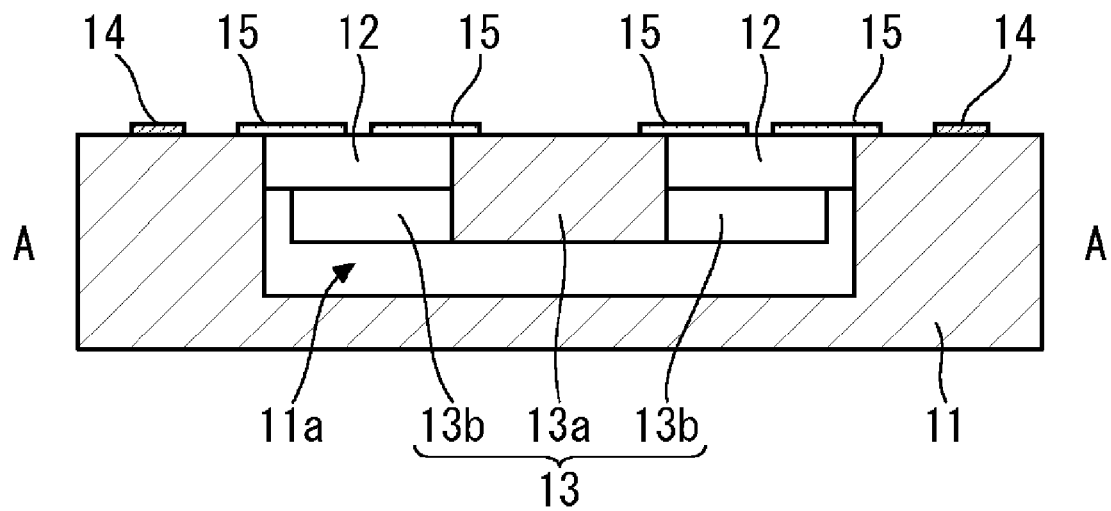
FIG. 3A is a sectional view of the semiconductor acceleration sensor chip taken along line A-A shown in FIG. 2.
Figure 3B:
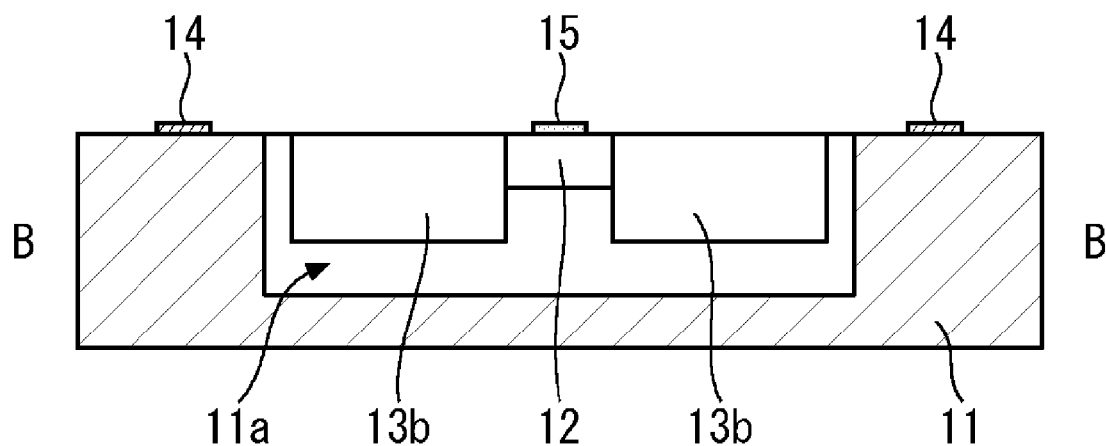
FIG. 3B is a sectional view of the semiconductor acceleration sensor chip taken along line B-B shown in FIG. 2.

FIG. 1 is a perspective view showing an outline structure of the semiconductor acceleration sensor chip 10, which is the three-dimensional acceleration sensor applied in this embodiment. FIG. 2 is an overhead view of the semiconductor acceleration sensor chip 10. FIG. 3A is a sectional view of the semiconductor acceleration sensor chip 10 taken along line A-A shown in FIG. 2, and FIG. 3B is a sectional view of the semiconductor acceleration sensor chip 10 taken along line B-B shown in FIG. 2.

As shown in FIG. 1 to FIG. 3B, the semiconductor acceleration sensor chip 10 has a fixing portion 11, beams 12, a spindle body 13, electrode pads 14 (i.e., first electrode pads) and piezoresistive elements 15. The fixing portion 11, the beams 12 and the spindle body 13 are integrated into a single body by processing a predetermined semiconductor substrate. The predetermined semiconductor substrate may be a silicon substrate, for instance.

The fixing portion 11 has a groove 11a formed on the main surface (to be considered as an upper face) of a plate member, for instance. The opening shape of the groove 11a is square, for instance. The fixing portion 11 in the present invention, however, is not limited to such structure, and it is also possible to have a structure in which the opening penetrates through the upper and lower faces of the plate member. Moreover, the shape of the upper face of the plate member and the groove or the opening shape of the groove is not limited to a square shape as shown in FIG. 1 to FIG. 3B, and it is also possible to have a polygon or circular shape, for instance.

The circumference of the upper face of the fixing portion 11 is about 1.6 mm (millimeters) on a side, for instance. In the meantime, the circumference of the square groove 11a making up the opening is about 1.2 mm on a side, for instance. The groove 11a may be about 0.3 mm deep, for instance. Under these conditions, the distance between the circumference of the fixing portion 11 and the groove 11a should be about 0.2 mm. The thickness of the fixing portion 11 may be about 0.5 mm, for instance.

The beam 12 is disposed at the approximate midpoint of each side of the square groove 11a in the fixing portion 11 and extends toward the center of the opening. However, the present invention is not limited to such structure, and it is also possible to have a structure in which the beam 12 is disposed at each corner of the square groove 11a in the fixing portion 11 and extends toward the center.

The beams 12 are formed so that each will bend due to the stress generated by the inertial movement of the spindle body 13 at the time when acceleration is added to the semiconductor acceleration sensor chip 10. That is, the beams 12 are arranged such that they can have flexibility. In this embodiment, each beam 12 is made to be about 0.1 mm in width on the upper face and about 0.1 mm thick, for instance, in order to be able to have flexibility. Furthermore, each beam 12 is formed such that its upper face will come level with the upper face of the fixing portion 11. Thereby, there will be a gap of about 0.2 mm between the lower faces of the beams 12 and the bottom face of the groove 11a and deformation of the beams 12 will not be hindered by the bottom face of the groove 11a and so forth.

The spindle body 13 has four main spindle bodies 13b and a support portion 13a placed in the middle. That is, the support portion 13a is surrounded by the four main spindle bodies 13b. The support portion 13a is suspended by the four beams 12 extending from the fixing portion 11 such that it will be positioned at the approximate center of the opening (i.e., the square groove 11a) in the fixing portion 11, and such that it will be in a movable state. Here, each of the main spindle bodies 13b is disposed at each corner of the square groove 11a in a way not touching the fixing portion 11.

The spindle body 13 functions as a weight for causing the beams 12 to bend in response to acceleration added to the semiconductor acceleration sensor chip 10. In this embodiment, the upper face of the support portion 13a is about 0.5 mm on a side, and the upper face of each main spindle body 13b is about 4.5 mm on a side, for instance. Moreover, the width of the gap between the main spindle body 13b and the fixing portion or each beam portion 12 is about 0.5 mm, for instance. Furthermore, the thickness of the support portion 13a and the main spindle body 13b is about 0.2 mm, for instance.

Here, the spindle body 13 is formed such that its upper face will be at the same level as the upper faces of the fixing portion 11 and the beams 12. By this arrangement, there will be a gap of about 0.1 mm between the lower face of the spindle body 13 and the bottom face of the groove 11a in the fixing portion 11, and thereby, displacement of the spindle body 13 with respect to the fixing portion 11 will not be hindered by the bottom face of the groove 11a, etc.

On the upper face of each of the beams 12, piezoresistive elements 15 are attached to a base of the beams with respect to the fixing portion 11 and to a base of the beam with respect to the spindle body 13, respectively. These piezoresistive elements 15 are electrically connected to the electrode pads 14 formed on the upper face of the fixing portion 11 through wiring patterns (not shown), thus establishing a Wheatsone bridge circuit. Accordingly, by detecting the resistance balance of the piezoresistive elements 15 through the electrode pads 14 and the wiring patterns (not shown), it is possible to detect the amount of bending in the beams 12, and based on the amount of bending in the beam 12, it is possible to specify the magnitude and direction of acceleration added to the semiconductor acceleration sensor chip 10.

Here, on the back side of the semiconductor acceleration sensor chip 10, a glass substrate, etc. may be attached according to need. In such case, the glass substrate may be attached to the semiconductor acceleration sensor chip 10 using an anodic bonding method, etc., for instance.

Structure of Semiconductor Device 100

Now, the structure of a semiconductor device 100 according to the first embodiment of the present invention will be described in detail with reference to the drawings. The semiconductor device 100 is formed by packaging the above-described semiconductor acceleration sensor chip 10.

Figure 4:
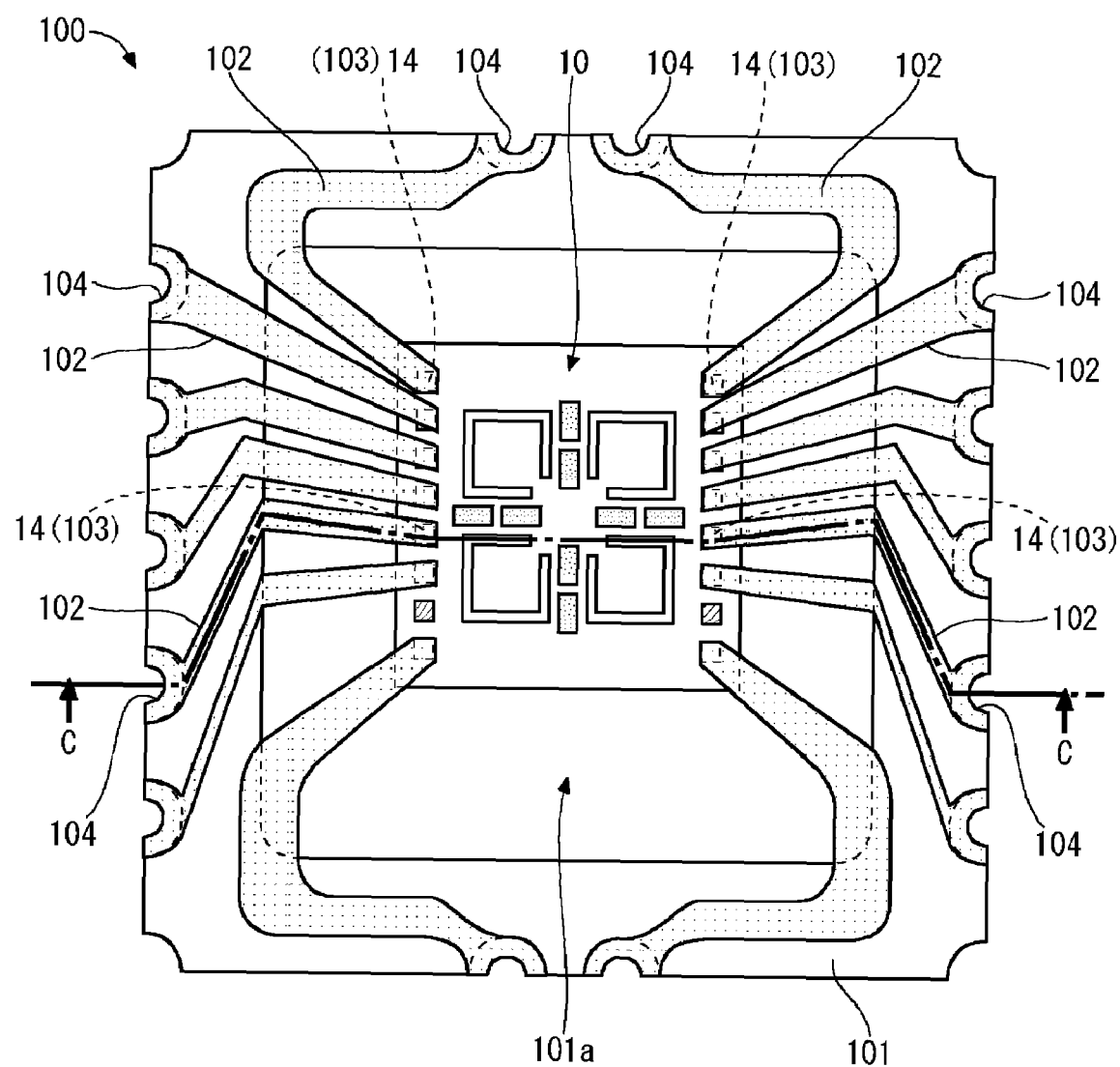
FIG. 4 is an overhead view of a semiconductor device according to a first embodiment of the present invention.
Figure 5:
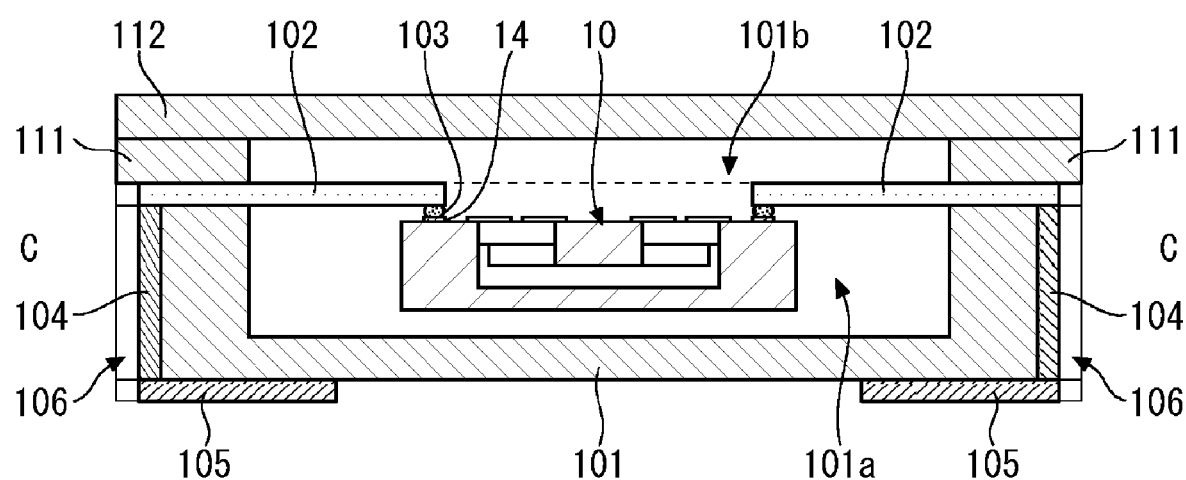
FIG. 5 is a sectional view of the semiconductor device according to the first embodiment of the present invention taken along line C-C shown in FIG. 4.

FIG. 4 is an overhead view of the semiconductor device 100. FIG. 5 is a sectional view of the semiconductor device 100 taken along line C-C shown in FIG. 4. In FIG. 4, for the convenience of explanation, the semiconductor device 100 is shown in a state in which a spacer 111 and an upper lid 112 are omitted.

As shown in FIG. 4 and FIG. 5, the semiconductor device 100 comprises the semiconductor acceleration sensor chip 10, a lower container 101, an upper lid 112, a spacer 111, and terminals 102. Here, the lower container 101, the spacer 111 and the upper lid 112 form a package for housing the semiconductor acceleration sensor chip 10. In the following, for the convenience of explanation, the side where the upper lid 112 is positioned so as to oppose the lower container 101 will be considered as the upper side.

The lower container 101 is a ceramic package having a laminated structure, for instance, and it includes a cavity 101a for housing the semiconductor acceleration sensor chip 10.

Here, the cavity 101a is slightly larger than the semiconductor acceleration sensor chip 10 in size. As described above, if the circumference of the fixing portion 11 of the semiconductor acceleration sensor chip 10 is about 1.6 mm on one side and the thickness of the fixing portion 11 is about 0.5 mm, for instance, the opening of the cavity 101a should be about 2.0 mm on one side and the depth of the cavity 101a should be about 0.7 mm, for instance. By such arrangement, the semiconductor acceleration sensor chip 10 can be suspended inside the hollow space of the cavity 101a.

On the outer sides of the lower container 101, multiple grooves 106 are formed. Each groove 106 has a semicircular shape in cross-section, and it is plated with a conductive material such as copper, silver, or gold, etc. which forms a castellation (also referred to as a side electrode) 104 on the outer surface of the groove 106. The castellations 104 function as wirings that electrically connect between the upper face and the lower face of the lower container 101. Moreover, at the lower face of the lower container 101, foot patterns 105 (i.e., second electrode pads) which electrically connect with the electrode pads of a circuit substrate (not shown) are formed.

On the upper face of the sidewalls of the lower container 101 surrounding the cavity 101a, multiple terminals 102 are attached. These terminals 102 extend toward the opening of the cavity 101a, and they function as supporting members for suspending the semiconductor acceleration sensor chip 10 in the hollow space of the cavity (101a, 101b). The terminals 102 can be formed by processing a plate member having conductivity, such as a silicon plate containing predetermined impurities, a metal plate made of copper, silver, or gold, etc., or the like. Moreover, the terminals 102 are electrically connected with the castellations 104 formed on the outer sides of the lower container 101. Accordingly, the terminals 102 are electrically connected to the foot patterns 105 at the lower face of the lower container 101 via the castellations 104.

At the tips of the terminals 102 attached to the upper face of the sidewalls of the lower container 101, the electrode pads 14 of the semiconductor acceleration sensor chip 10 are connected both electrically and physically by bumps 103, respectively. As for the bumps 103, conductive bumps, such as metal bumps or solder bumps, etc. can be applied. Through these bumps 103, the semiconductor acceleration sensor chip 10 can be kept suspended inside the cavity 101a by the terminals 102.

Here, there should be enough space between the semiconductor acceleration sensor chip 10 and the internal surface of the cavity 101a to keep the semiconductor acceleration sensor chip 10 untouched by the internal surface of the cavity 101a even when the package (i.e., the lower container 101, spacer 111 and the upper lid 112) is deformed by heat, external stress, etc. That is, it is preferable that the semiconductor acceleration sensor chip 10 is suspended in a hollow space inside the package made up of the lower container 101, the spacer 111 and the upper lid 112. For instance, with the measurements of the semiconductor acceleration sensor chip 10 and the cavity 101a as described above, there is supposed to be at least about a 2.0 mm space between the semiconductor acceleration sensor chip 10 and the internal surface of the cavity 101a. Therefore, the semiconductor acceleration sensor chip 10 can be kept untouched by the internal surface of the cavity 101a even when the package (i.e., the lower container 101, the spacer 111 and the upper lid 112) is deformed by heat, external stress, etc.

Here, each terminal 102 should have at least enough strength to hold the semiconductor acceleration sensor chip 10 together with all the other terminals 102. Such strength can be obtained by setting the thickness of the terminal 102 to an appropriate value, for instance. In this particular embodiment, the thickness of the terminal 102 is set to about 1.0 mm, for instance.

The lower container 101 housing the semiconductor acceleration sensor chip 10 is sealed by the upper lid 112. Here, it should be arranged such that the spacer 111 is disposed between the lower container 101 and the upper lid 112 to create a predetermined gap (i.e., a cavity 101b) between the upper lid 112 and the terminals 102 except for the parts on the sidewalls of the lower container 101. By having this cavity 101b, the terminals 102 can be suspended in a hollow space while not touching the upper lid 112 even when the upper lid 112 is deformed by heat, external stress, etc., for instance. That is, it is possible to obtain a structure in which possible deformation of the upper lid 112 will not be transmitted to the semiconductor acceleration sensor chip 10 through the terminals 102.

The spacer 111 and the upper lid 112 are fixed to the lower container 101 by means of a thermosetting resin such as epoxy resin. As for the material for forming the spacer 111 and the upper lid 112, it is possible to use a 42 metal alloy, a stainless material, etc., for instance. In the meantime, the inside of the sealed package (i.e., the lower container 101, the spacer 111 and the upper lid 112) is purged by nitrogen gas or dry air, etc., for instance.

In this way, the semiconductor device 100 according to this embodiment has terminals 102 which have portions that extend out from certain faces (i.e., lateral faces in this embodiment) of the cavity (101a, 101b) made up of the lower container 101, the spacer 111 and the upper lid 112, and portions that do not extend out to the cavity (101a, 101b). By these terminals 102, the semiconductor acceleration sensor chip 10 can be suspended in a hollow space inside the cavity (101a, 101b). In other words, the semiconductor device 100 has a structure in which the semiconductor element is fixed to the terminals 102, which have portions that extend out from certain faces (i.e., lateral faces in this embodiment) of the cavity (101a, 101b) made up of the lower container 101, the spacer 111 and the upper lid 112, in a way such that the semiconductor element will not touch any of the faces of the cavity (101a, 101b). With this structure, even when the package (101, 111, 112) happens to be deformed by external stress, heat expansion, etc., it is possible to prevent the deformation from being transmitted directly to the semiconductor acceleration sensor chip 10, and thereby it will become possible to reduce changes in the operational characteristics of the semiconductor acceleration sensor chip 10. This means that with this structure, it is possible to make the semiconductor device operate stably against possible deformation generated in the package, which houses the semiconductor acceleration sensor chip 10, due to external stress, heat expansion, etc.

Furthermore, with the structure according to this embodiment, when the package (101, 111, 112) happens to expand or stretch due to heat, for instance, the terminals 102 will also expand or stretch due to the heat. Accordingly, the stress acting on the semiconductor acceleration sensor chip 10 due to the deformation of the package (101, 111, 112) can be lessened by the deformation of the terminals 102. In other words, because of the terminals 102, it is possible to lessen the stress generated due to the difference in the heat expansion coefficient between the package (101, 111, 112) and the semiconductor acceleration sensor chip 10. Therefore, according to this embodiment, it is possible to realize a semiconductor device which is capable of operating stably against heat.

Method of Manufacturing Semiconductor Device 100

Now, a method of manufacturing the semiconductor device 100 according to the first embodiment of the present invention will be described in detail with reference to the drawings.

Figure 6:
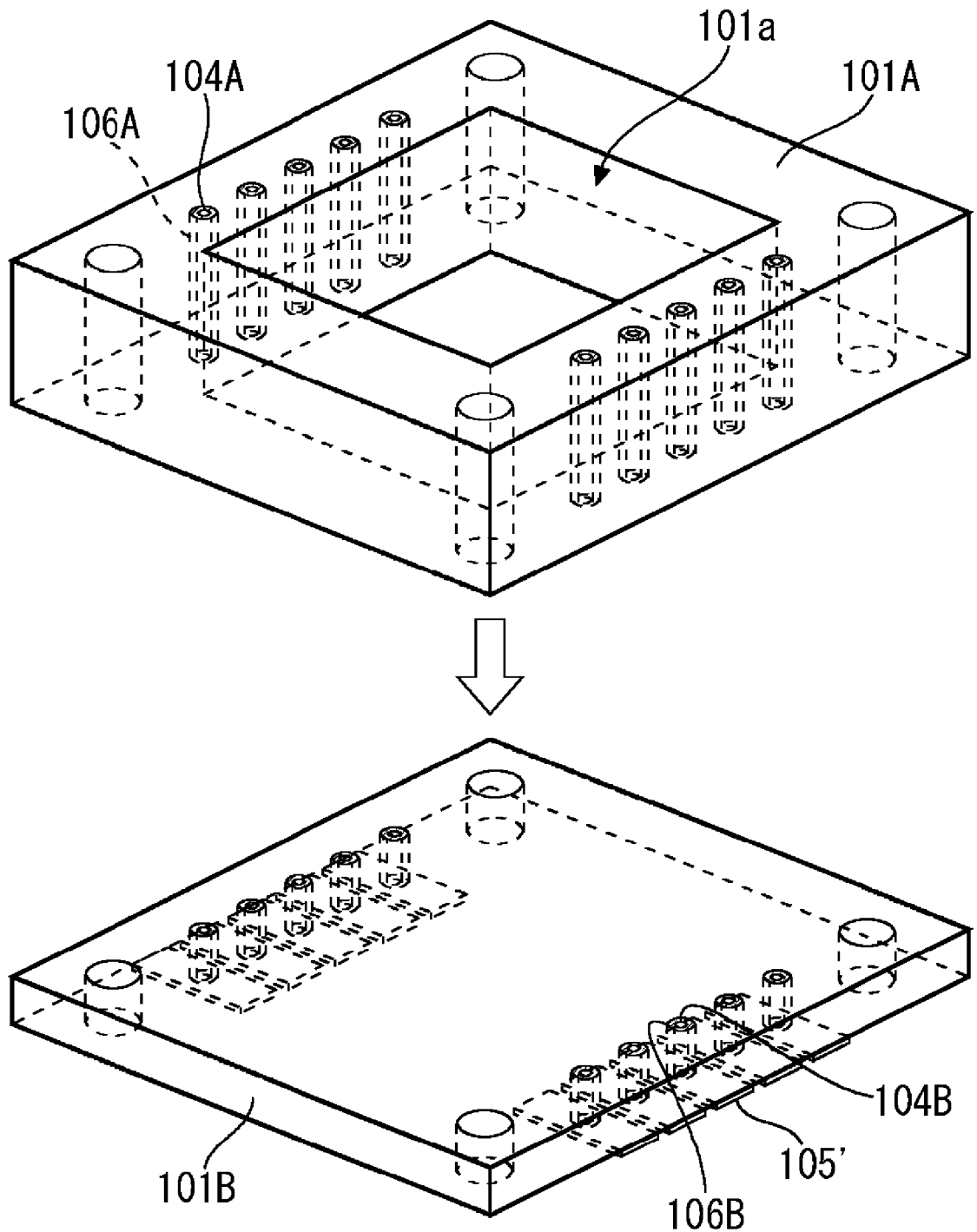
FIGS. 6 to 10 are diagrams showing processes of manufacturing the semiconductor device according to the first embodiment of the present invention.

In this manufacturing method, first, as shown in FIG. 6, a green sheet 101A for forming the sidewalls of the cavity 101a and a green sheet 101B for forming the bottom plate of the cavity 101a will be prepared in constructing the lower container 101. Here, each of the green sheets 101A and 101B may have a multi-layer structure including multiple green sheets.

The green sheet 101B has via holes 106B for forming parts of the castellations 104 that are opened by a puncher, for instance. The green sheet 101A has via holes 106A for forming parts of the castellations 104 that are opened by a puncher, for instance. The green sheet 101A also has the cavity 101a being opened by a puncher, for instance. Here, it is arranged such that the via holes 106A of the green sheet 101A will overlap the via holes 106B of the green sheet 101B when the green sheet 101A is placed over the green sheet 101B. These via holes 106B and 106A have conductive patterns 104B and 104A formed inside by a screen printing method, for instance. The conductive patterns 104B and 104A will be eventually processed into castellations 104.

Next, the green sheets 101B and 101A are laminated sequentially, pressed from above and below, and then have a calcination process conducted thereon, to form a pre-diced lower container 101' including the cavity 101a, via wirings 104' which will be processed into the castellations 104, and metal pads 105' which will be processed into the foot patterns 105. This calcination process may be conducted under normal pressure at a temperature of 1500° C. for 24 hours.

Figure 7A:
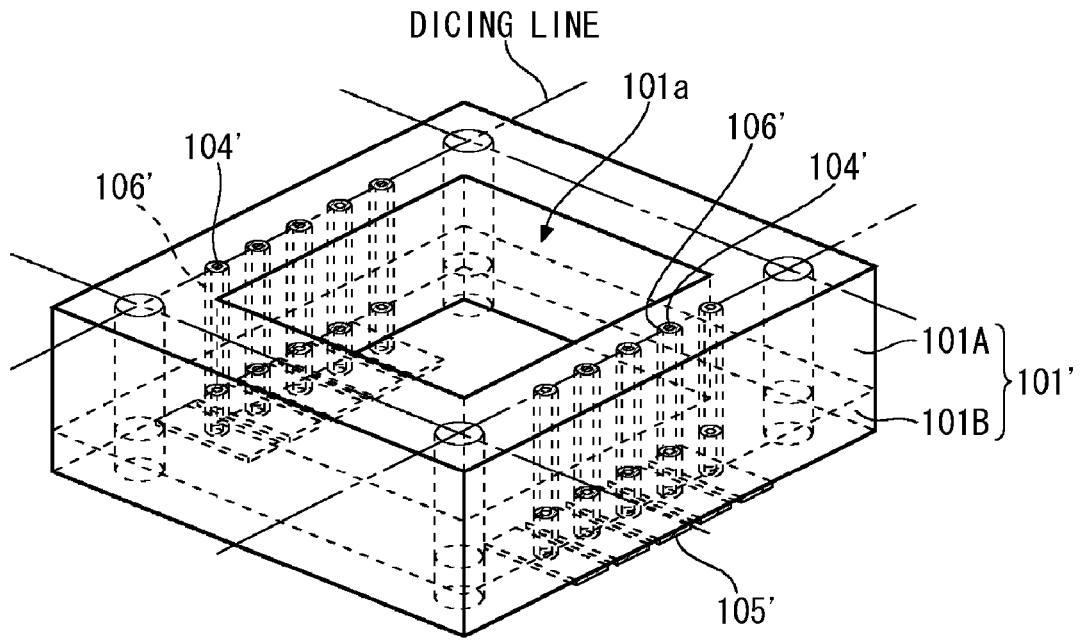
Figure 7B:
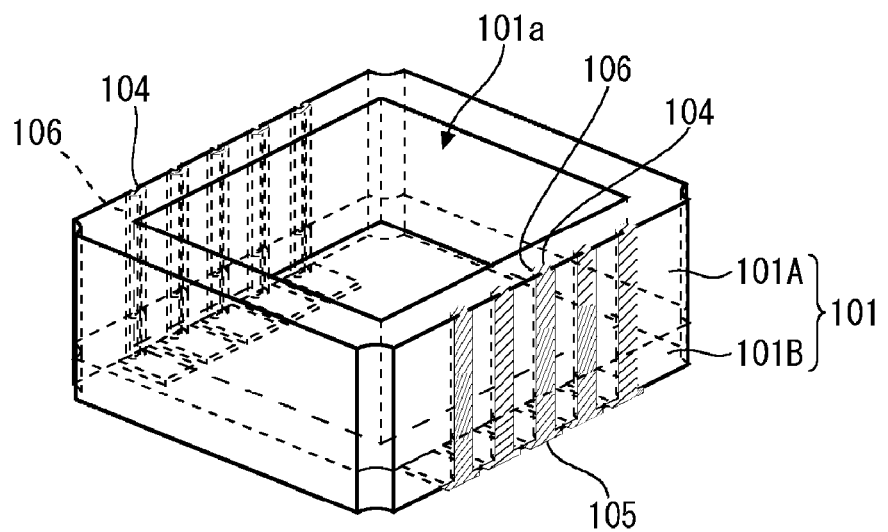

Next, as shown in FIG. 7A, the pre-diced lower container 101' is diced along predetermined dicing lines using a dicing blade (not shown), for instance. Thereby, the lower container 101' will be processed into an individual lower container 101, as shown in FIG. 7B. At this time, the via wirings 104' and the metal pads 105' will be processed into the castellations 104 and the foot patterns 105, respectively.

With respect to preparing the semiconductor acceleration sensor chip 10 in this manufacturing method, since a conventionally used method can be applied in manufacturing the semiconductor acceleration sensor chip, a detailed description thereof will be omitted here.

Figure 8:
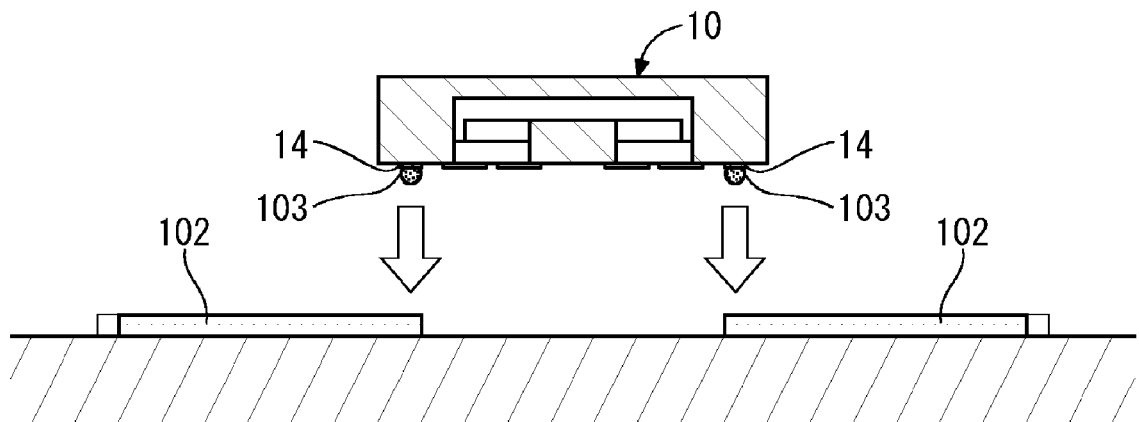

Next, as shown in FIG. 8, the electrode pads 14 of the semiconductor acceleration sensor chip 10 are made to connect with the tips of the terminals 102 both electrically and physically using the bumps 103 made of gold or solder, etc., for instance. At this time, for example, it is possible to adopt a method in which the terminals 102 are placed on a predetermined working table and then have the semiconductor acceleration sensor chip 10 with the bumps 103 attached to the electrode pads 14 appropriately placed thereon face-down, after which the terminals 102 and the semiconductor acceleration sensor chip 10 are heated and then cooled.

Figure 9:
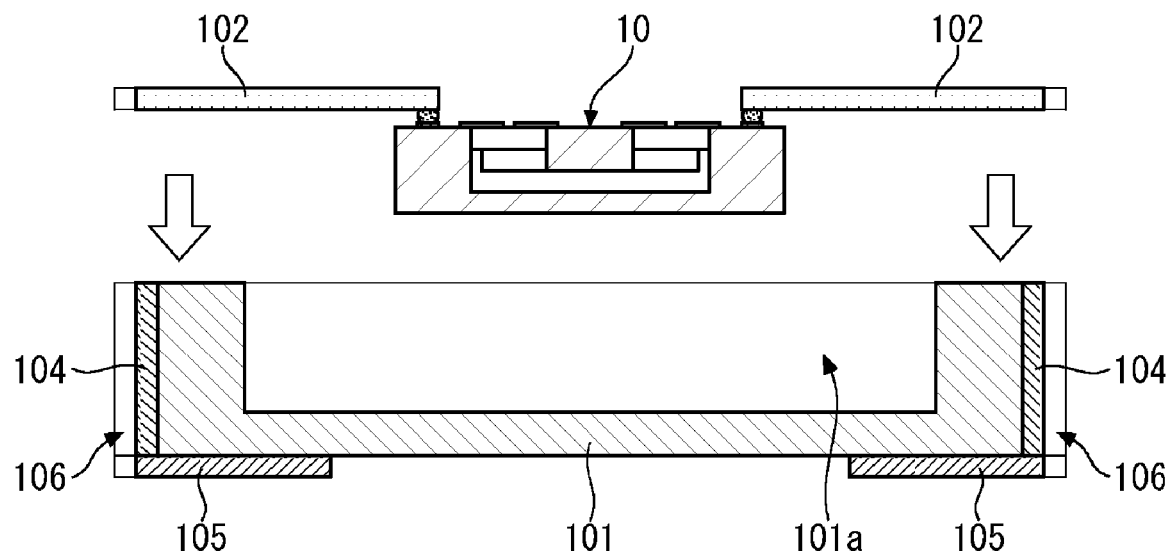

After the diced lower container 101 and the semiconductor acceleration sensor chip 10 with the terminals 102 attached thereto are prepared in the above-described way, the semiconductor acceleration sensor chip 10 is placed inside the cavity 101a of the lower container 101, as shown in FIG. 9. By this process, each of the terminals 102 attached to the electrode pads 14 of the semiconductor acceleration sensor chip 10 will have its outer portion placed on the surface of the sidewalls of the lower container 101. At this time, the outer portion of each terminal 102 will be contacting the upper face of the castellation 104 exposed on the upper face of the sidewalls of the lower container 101. Then, by conducting pressuring and heating processes on the structure in this state, the outer portions of the terminals 102 will be fixed to the upper face of the sidewalls of the lower container 101, and the terminals 102 will become electrically connected to the castellations 104.

Figure 10:
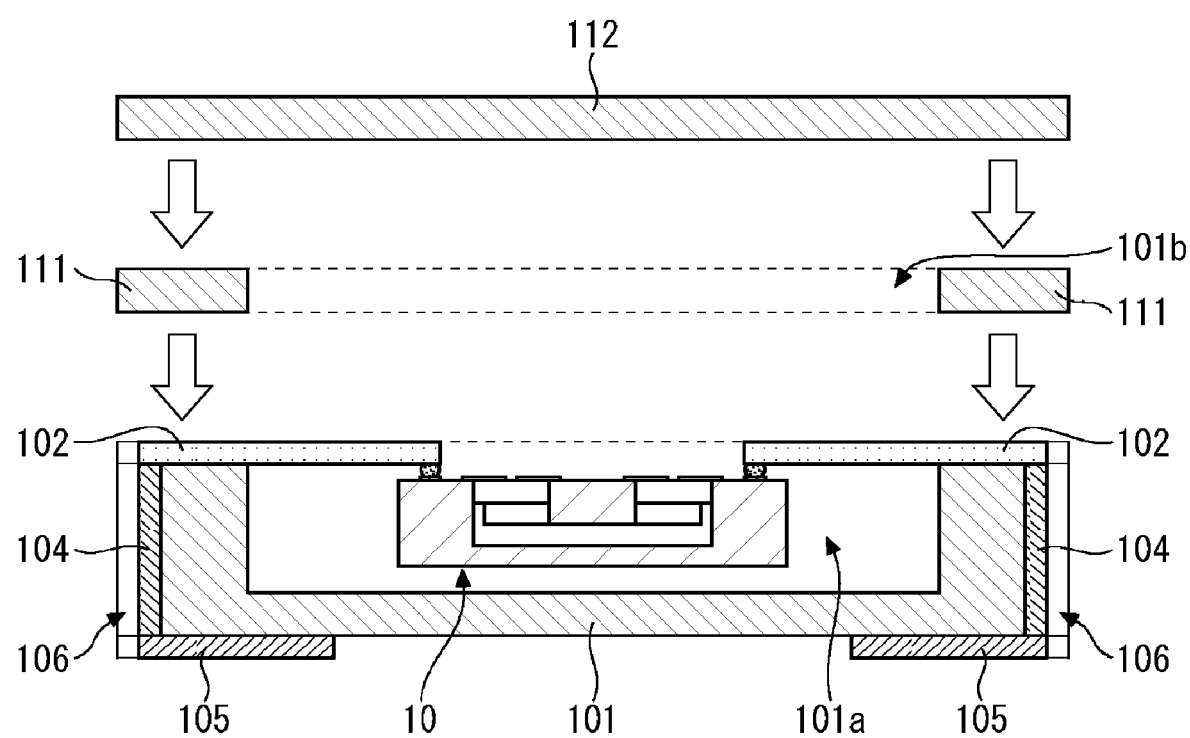

Next, the spacer 111 and the upper lid 112 made of 42 alloy metal or stainless material, etc. are prepared and sequentially laminated onto the lower container 101 which houses the semiconductor acceleration sensor chip 10, as shown in FIG. 10. Then, this laminated structure including the lower container 101, the spacer 111 and the upper lid 112 are heat-treated while being pressed from above and below. Thereby, the spacer 111 will be fixed to the lower container 101 and the upper lid 112 will be fixed to the spacer 111 at the same time. Through these processes, the cavity (101a, 101b) formed by the lower container 101 and the spacer 111 will be sealed by the upper lid 112. In this way, the semiconductor device 100 as illustrated in FIG. 4 and FIG. 5 can be manufactured. Here, the heat treatment may be conducted under 5 kg (/cm$^2$) of pressure at a temperature of 150° C. for two hours. In sealing the lower container 101 and the spacer 111 with the upper lid 112, the cavity 101a and the cavity 101b should be purged by nitrogen gas or dry air, etc., for instance.

As described above, the semiconductor device 100 according to the first embodiment of the present invention has a structure including a package (a lower container 101, a spacer 111 and an upper lid 112) having a cavity (101a, 101b) inside, terminals 102 sticking out from certain faces of the cavity (101a, 101b), and a semiconductor acceleration sensor chip 10 fixed to the terminals 102 in a way not touching any of the faces that form the cavity (101a, 101b).

By arranging the semiconductor acceleration sensor chip 10 to be fixed to the terminals 102 that extend out from certain faces of the cavity (101a, 101b), it is possible to hold the semiconductor acceleration sensor chip 10 inside the package in a way such that the semiconductor acceleration sensor chip 10 will not touch any of the faces that form the cavity (101a, 101b). Therefore, even when the package happens to be deformed by external stress, heat expansion, etc., it is possible to prevent the deformation from being transmitted directly to the semiconductor acceleration sensor chip 10. As a result, it will be possible to reduce changes in the operational characteristics of the semiconductor acceleration sensor chip 10 due to external stress, heat expansion, etc. that occur in the package. This means that with this structure, it is possible to make the semiconductor device 100 operate stably against possible deformation generated in the package.

Furthermore, with the structure according to this embodiment, when the package happens to expand or stretch due to heat, for instance, the terminals 102 will also expand or stretch due to the heat. Accordingly, the stress acting on the semiconductor acceleration sensor chip 10 due to the deformation of the package can be lessened by the deformation of the terminals 102. In other words, because of the terminals 102, it is possible to lessen the stress generated due to the difference in the heat expansion coefficient between the package and the semiconductor acceleration sensor chip 10. Therefore, according to this embodiment, it is possible to realize a semiconductor device 100 which is capable of operating stably against heat.

Referring to other conditions in this embodiment, the terminals 102 are terminals having conductivity, the semiconductor acceleration sensor chip 10 has electrode pads 14 connected to the terminals 102 both electrically and physically and by means of the connections between the terminals 102 and the electrode pads 14, the semiconductor acceleration sensor chip 10 is fixed to the terminals 102.

Moreover, in this embodiment, conductive bumps are used in fixing the semiconductor acceleration sensor chip 10 to the terminals 102. In addition, in this embodiment, the terminals 102 may be grounded.

Second Embodiment

Next, a second embodiment of the present invention will be described in detail with reference to the drawings. In the following, the same reference numbers will be used for the structures that are the same as the first embodiment, and redundant explanations of those structural elements will be omitted.

In the following, as in the first embodiment, a semiconductor acceleration sensor chip is also applied as a semiconductor element having a hollow construction, and a description will be given of a semiconductor device including the semiconductor acceleration sensor chip and of a method of manufacturing such semiconductor device, as an example of the present invention. The semiconductor acceleration sensor chip in this embodiment is the same as the semiconductor acceleration sensor chip 10 in the first embodiment, and redundant description thereof will be omitted.

Structure of Semiconductor Device 200

Now, the structure of a semiconductor device 200 according to the second embodiment of the present invention will be described in detail with reference to the drawings. The semiconductor device 200 is formed by packaging the above-described semiconductor acceleration sensor chip 10.

Figure 11:
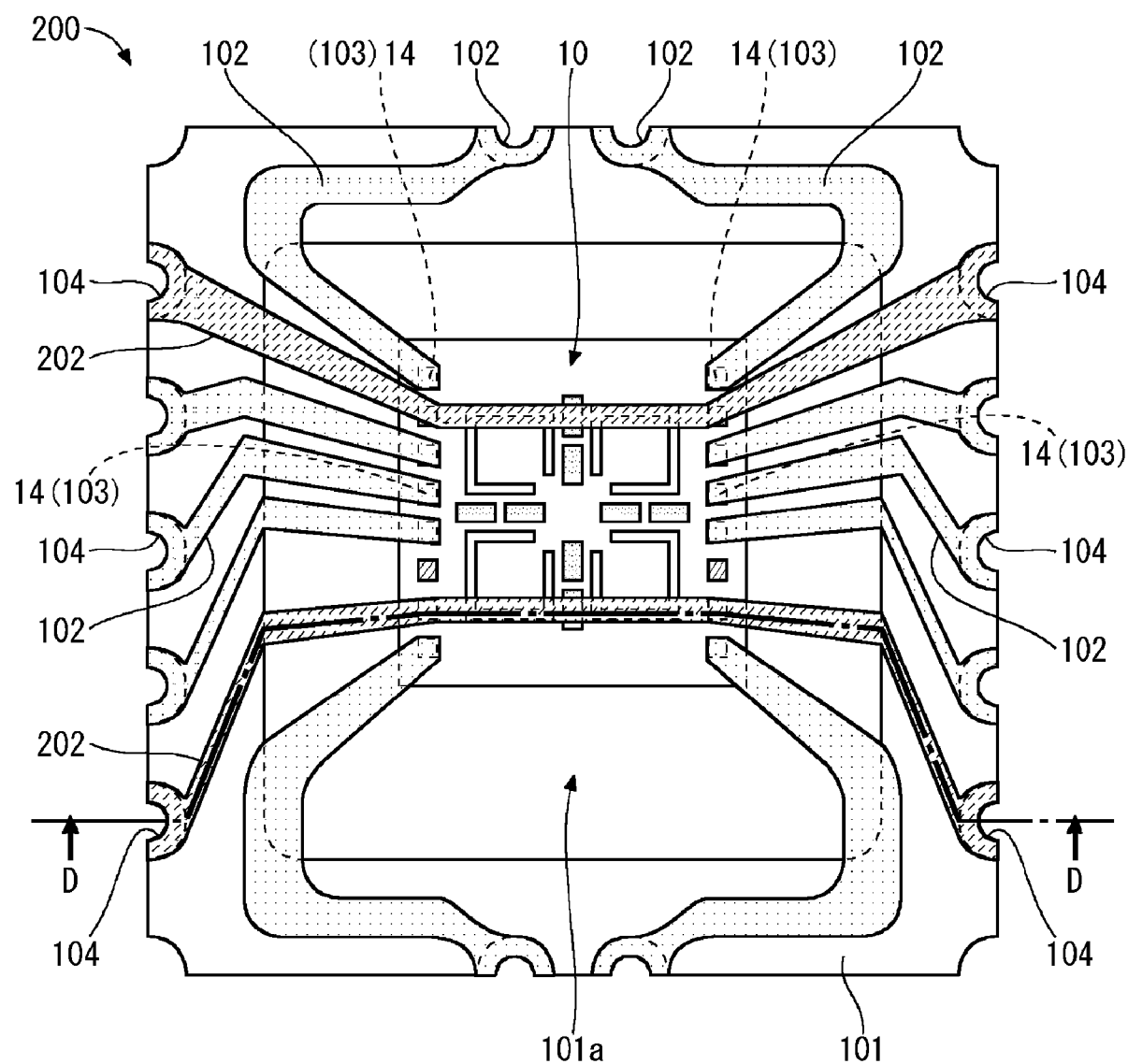
FIG. 11 is an overhead view of a semiconductor device according to a second embodiment of the present invention.
Figure 12:
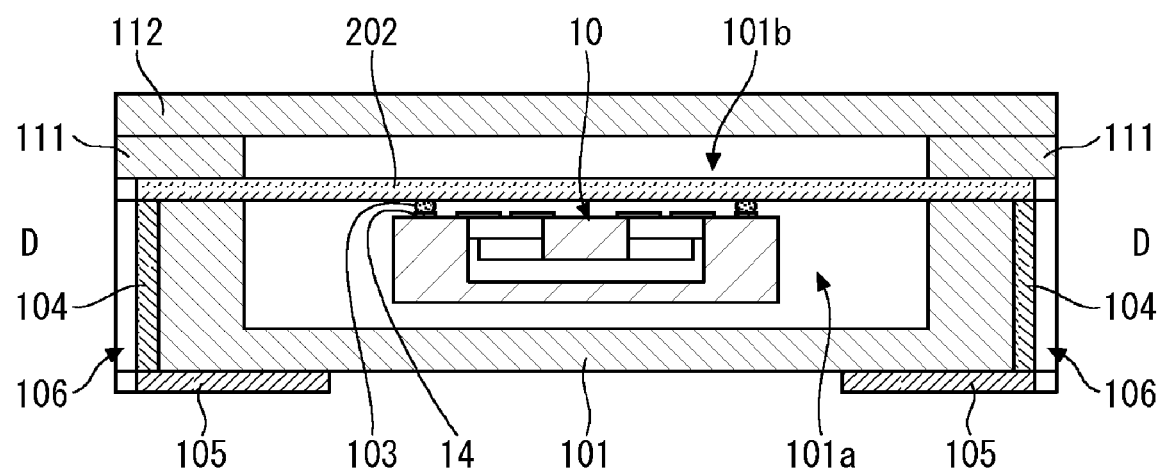
FIG. 12 is a sectional view of the semiconductor device according to the second embodiment of the present invention taken along line D-D shown in FIG. 11.

FIG. 11 is an overhead view of the semiconductor device 200. FIG. 12 is a sectional view of the semiconductor device 200 taken along line D-D shown in FIG. 11. In FIG. 11, for the convenience of explanation, the semiconductor device 200 is shown in a state in which the spacer 111 and the upper lid 112 are omitted.

As shown in FIG. 11 and FIG. 12, the semiconductor device 200 has the same structure as the semiconductor device 100 in the first embodiment and further has dummy terminals 202.

As with the terminals 102 in the first embodiment, the dummy terminals 202 have portions that extend out from certain faces (i.e., lateral face in this embodiment) of the cavity (101a, 101b) that is formed by the lower container 101, the spacer 111 and the upper lid 112. By this arrangement, as with the terminals 102, the dummy terminals 202 function as supporting members for suspending the semiconductor acceleration sensor chip 10 in a hollow space of the cavity (101a, 101b). The dummy terminals 202 are bonded to the electrode pads 14 by bumps 103 using the flip-flop technique. A portion of each dummy terminal 202 extends above the spindle body 13, in particular the main spindle bodies 13b, while having a predetermined gap (i.e., a clearance) between the dummy terminal 202 and the spindle body 13.

By arranging the dummy terminals 202 over the spindle body 13, which is a movable portion, while keeping a predetermined space between the dummy terminals 202 and the spindle body 13, it is possible to control the displacement of the spindle body 13. This means that it is possible to prevent the spindle body 13 from moving excessively due to acceleration added to the semiconductor device 200 by accidental shock or the like. Thereby, it will be possible to prevent the beams 12, etc. from being damaged due to excessive displacement of the spindle body 13 caused by excessive acceleration added thereto. As a result, it will be possible to prevent the characteristics of the semiconductor device 200 from deteriorating. Referring to the predetermined space between the dummy terminals 202 and the spindle body 13, it can be specified using the bumps 103.

As with the terminals 102 in the first embodiment for instance, the dummy terminals 202 can be formed by processing a plate member having conductivity, such as a silicon plate containing predetermined impurities, a metal plate made of copper, silver, or gold, etc., or the like. However, the present invention is not limited to this forming method of the dummy terminals 202, and they can be formed by processing a plate member having insulation properties. In the case when the dummy terminals 202 are formed by processing a plate member having conductivity, the dummy terminals 202 should be grounded via the castellations 104.

Figure 13:
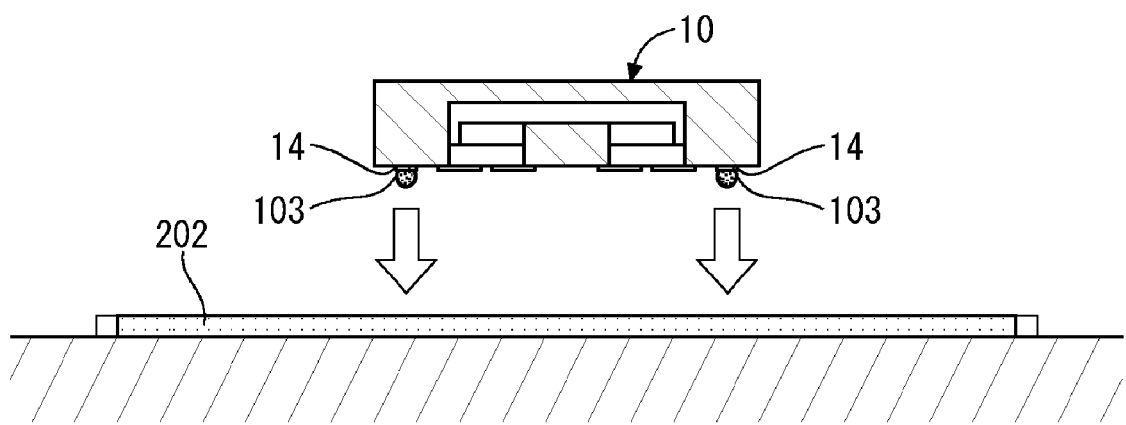
FIG. 13 is a diagram showing a process of manufacturing the semiconductor device according to the second embodiment of the present invention.

The rest of the structure and the method of forming the semiconductor device 200 is the same as the first embodiment of the present invention, and redundant explanations of this manufacturing method will be omitted. However, in the process of bonding the terminals 102 to the electrode pads 10 by means of the bumps 103 (q.b., FIG. 8), the dummy terminals 202 are made to connect with the predetermined electrode pads 14 both electrically and physically using the bumps 103, as shown in FIG. 13.

As described above, the semiconductor device 200 according to the second embodiment of the present invention has a structure including a package (a lower container 101, a spacer 111 and an upper lid 112) having a cavity (101a, 101b) inside, terminals 102 and dummy terminals 202 that extend out from certain faces of the cavity (101a, 101b), and a semiconductor acceleration sensor chip 10 fixed to the terminals 102 and the dummy terminals 202 in a way not touching any of the faces that form the cavity (101a, 101b).

By arranging the semiconductor acceleration sensor chip 10 to be fixed to the terminals 102 and the dummy terminals 202 sticking out from certain faces of the cavity (101a, 101b), it is possible to hold the semiconductor acceleration sensor chip 10 inside the package in a way such that the semiconductor acceleration sensor chip 10 will not touch any of the faces that form the cavity (101a, 101b). Therefore, even when the package happens to be deformed by external stress, heat expansion, etc., it is possible to prevent the deformation from being transmitted directly to the semiconductor acceleration sensor chip 10. As a result, it will be possible to reduce changes in the operational characteristics of the semiconductor acceleration sensor chip 10 due to external stress, heat expansion, etc. applied to the package. This means that with this structure, it is possible to make the semiconductor device 200 operate stably against possible deformation generated in the package.

Furthermore, with the structure according to this embodiment, when the package happens to expand or stretch due to heat, for instance, the terminals 102 and the dummy terminals 202 will also expand or stretch due to the heat. Accordingly, the stress acting on the semiconductor acceleration sensor chip 10 due to the deformation of the package can be lessened by the deformation of the terminals 102 and the dummy terminals 202. In other words, because of the terminals 102 and the dummy terminals 202, it is possible to lessen the stress generated due to the difference in the heat expansion coefficient between the package and the semiconductor acceleration sensor chip 10. Therefore, according to this embodiment, it is possible to realize a semiconductor device 200 which is capable of operating stably against heat.

Referring to other conditions in this embodiment, the terminals 102 are terminals having conductivity, while the dummy terminals 202 do not necessarily have to have conductivity. The semiconductor acceleration sensor chip 10 has electrode pads 14 connected to the terminals 102 and electrode pads 14 connected to the dummy terminals 202 both electrically and physically, and by means of the connections between the terminals 102 and the electrode pads 14 and between the dummy terminals 202 and the other electrode pads 14, the semiconductor acceleration sensor chip 10 is fixed to the terminals 102 and the dummy terminals 202.

Moreover, in this embodiment, conductive bumps are used in fixing the semiconductor acceleration sensor chip 10 to the terminals 102 and the dummy terminals 202. In addition, in this embodiment, the terminals 102 or the dummy terminals 202 may be grounded.

Furthermore, in this embodiment, at least a portion of each dummy terminal 202 extends over the spindle body 13 in the semiconductor acceleration sensor chip 10 while having a predetermined space in between the dummy terminal 202 and the spindle body 13.

By arranging the dummy terminals 202 over the spindle body 13, which is a movable portion, while keeping a predetermined space between the dummy terminals 202 and the spindle body 13, it is possible to control the displacement of the spindle body 13. This means that it is possible to prevent the spindle body 13 from moving excessively due to acceleration added to the semiconductor device 200 by accidental shock or the like. Thereby, it is made possible to prevent the beams 12, etc. from being damaged due to excessive displacement of the spindle body 13 caused by excessive acceleration added thereto. As a result, it will be possible to prevent the characteristics of the semiconductor device 200 from deteriorating. Referring to the predetermined space between the dummy terminals 202 and the spindle body 13, it can be specified using the bumps 103.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-283530. The entire disclosures of Japanese Patent Application No. 2005-283530 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A semiconductor device comprising:
a package with a cavity in the interior thereof, the cavity having a plurality of faces;
a plurality of support members that extend out from at least one of the faces of the cavity; and
a semiconductor element fixed to the support members without contacting the faces of the cavity,
wherein the semiconductor element is supported in the cavity by the support members only.

2. The semiconductor device according to claim 1, wherein
the support members are terminals having electrical conductivity, and
the semiconductor element comprises first electrode pads electrically and physically connected to the support member, the semiconductor element being fixed to the support members by the connection between the support members and the first electrode pads.

3. The semiconductor device according to claim 1, further comprising:
bumps having conductivity that are configured to fix the semiconductor element to the support members.

4. The semiconductor device according to claim 1, wherein at least one of the support members is a dummy terminal.

5. The semiconductor device according to claim 1, wherein at least one of the support members is grounded.

6. The semiconductor device according to claim 1, wherein the semiconductor element is a semiconductor acceleration sensor.

7. The semiconductor device according to claim 6, wherein the semiconductor acceleration sensor has a spindle body, and
at least a portion of the support members extend above the spindle body
while having a predetermined gap between the support member and the spindle body.

8. The semiconductor device according to claim 1, wherein the package comprises:
a container having a first portion of the cavity of the package,
a spacer having a second portion of the cavity of the package, the second portion of the cavity penetrating the spacer, and
a lid configured to seal the cavity,
wherein the support members extend toward the inside of the cavity from between the container and the spacer.

9. The semiconductor device according to claim 1, wherein the package comprises:
wiring patterns electrically connected to the support members, and
electrode pads electrically connected to the wiring patterns.

10. The semiconductor device according to claim 1, wherein at least one of the support members is a dummy terminal that extends out from one of the faces of the cavity.

11. The semiconductor device according to claim 10, wherein
the dummy terminal has electrical conductivity, and
the semiconductor element has first and second electrode pads, the first electrode pad being electrically and physically connected to one of the support members, the second electrode pad being electrically and physically connected to the dummy terminal, and the semiconductor element being fixed to one of the support members and the dummy terminal by means of the connections between the one of the support members and the first electrode pad and between the dummy terminal and the second electrode pad.

12. The semiconductor device according to claim 10, further comprising:
a first bump having electrical conductivity and being configured to fix the semiconductor element to one of the support members, and
a second bump having electrical conductivity and being configured to fix the semiconductor element to the dummy terminal.

13. The semiconductor device according to claim 10, wherein the dummy terminal is grounded.

14. The semiconductor device according to claim 10, wherein the semiconductor element is a semiconductor acceleration sensor.

15. The semiconductor device according to claim 14, wherein
the semiconductor acceleration sensor has a spindle body, and
at least a portion of the dummy terminal extends above the spindle body while having a predetermined gap between one of the support members and the spindle body.

16. The semiconductor device according to claim 10, wherein
the package comprises
a container having a first portion of the cavity of the package,
a spacer having a second portion of the cavity of the package, the second portion of the cavity penetrating the spacer, and
a lid configured to seal the cavity,
wherein the support members and the dummy terminal extend toward the inside of the cavity from between the container and the spacer, respectively.

17. The semiconductor device according to claim 10, wherein the package comprises
first wiring patterns electrically connecting to the support members,
a second wiring pattern electrically connecting to the dummy terminal, and
electrode pads electrically connected to the first and second wiring patterns, respectively.

18. The semiconductor device according to claim 1, wherein the support members are connected to an upper surface of the semiconductor element.

* * * * *